(12) United States Patent
Barnes

(10) Patent No.: US 6,348,828 B1
(45) Date of Patent: Feb. 19, 2002

(54) CLOCK ENABLE CIRCUIT FOR USE IN A HIGH SPEED REPROGRAMMABLE DELAY LINE INCORPORATING GLITCHLESS ENABLE/DISABLE FUNCTIONALITY

(75) Inventor: Robert K. Barnes, Ft. Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/672,903

(22) Filed: Sep. 29, 2000

(51) Int. Cl.[7] .............................. G06F 1/04; H03K 3/00
(52) U.S. Cl. .......................................... 327/298; 327/276
(58) Field of Search ................................ 327/261–267, 327/276–277, 284, 291, 292, 294, 298, 170, 172, 407

(56) References Cited

U.S. PATENT DOCUMENTS

| | | | |
|---|---|---|---|
| 4,657,406 A | 4/1987 | Yeada | 368/120 |
| 5,148,175 A | 9/1992 | Woolfolk | 342/95 |
| 5,457,719 A | 10/1995 | Guo et al. | 375/373 |
| 5,488,325 A | 1/1996 | Sato et al. | 327/286 |
| 5,532,633 A | 7/1996 | Kawai | 327/174 |
| 5,554,946 A | 9/1996 | Curran et al. | 327/172 |
| 5,589,788 A | 12/1996 | Gopto | 327/276 |
| 5,619,148 A | 4/1997 | Guo | 327/3 |
| 5,654,988 A * | 8/1997 | Heyward et al. | 375/355 |
| 5,690,114 A | 11/1997 | Chiang et al. | 128/660.07 |
| 5,719,516 A * | 2/1998 | Sharpe-Geisler | 327/291 |
| 5,760,609 A * | 6/1998 | Sharpe-Geisler | 326/93 |
| 5,999,023 A * | 12/1999 | Kim | 327/144 |
| 6,072,348 A * | 6/2000 | New et al. | 327/295 |
| 6,223,313 B1 * | 4/2001 | How et al. | 714/724 |

* cited by examiner

Primary Examiner—My-Trang Nu Ton

(57) ABSTRACT

A clock qualification circuit used to selectively enable a clock edge to transfer new delay data from a first-in-first-out (FIFO) circuit in a precision delay line circuit. The circuit qualifies the clock without generating undesirable pulses (glitches) and causing false loading of new delay data in a timing on the fly delay line implementation.

20 Claims, 4 Drawing Sheets

CLOCK ENABLE CIRCUIT FOR USE IN A HIGH SPEED REPROGRAMMABLE DELAY LINE INCORPORATING GLITCHLESS ENABLE/DISABLE FUNCTIONALITY

FIELD OF THE INVENTION

The present invention relates to an apparatus and method for providing clock edges for use in a high speed reprogrammable delay line incorporating glitchless enable/disable functionality.

BACKGROUND OF THE INVENTION

Precision delay line circuits requiring the real-time programming of delay line values every clock cycle have required restrictive rules of operation. For example, new delay values are only allowed to increase from one cycle to another, or specific delay values are not allowed. These rules have placed limitations on conventional delay line circuits. Accordingly, a need exists for improvements in precision delay line circuits.

SUMMARY OF THE INVENTION

A clock control circuit consistent with the present invention is used for loading delay data into delay circuits. It includes a clock enabled latch receiving an enable signal and a delay line signal. A latch receives the delay line signal and an output of the clock enabled latch. A multiplexer, receiving the output of the clock enabled latch and being controlled by an output of the latch, provides a signal to load delay data in response to the enable signal and the delay line signal.

Another clock control circuit consistent with the present invention is used for loading delay data into delay circuits. It includes an input for receiving an enable signal and a delay line signal, and an output for outputting a delayed clock signal having first and second states. A control circuit provides an enabled state with the delayed clock signal in the first state and an output state with the delayed clock signal in the second state. The control circuit switches between the enabled state and the output state in response to first and second edges of the delay line signal.

A method consistent with the present invention provides signals for use in loading delay data into delay circuits. It includes receiving an enable signal and a delay line signal, and outputting a delayed clock signal having first and second states. An enabled state is provided with the delayed clock signal in the first state, and an output state is provided with the delayed clock signal in the second state. Switching between the enabled state and the output state occurs in response to first and second edges of the delay line signal.

BRIEF DESCRIPTION OF THE DRAWINGS

The accompanying drawings are incorporated in and constitute a part of this specification and, together with the description, explain the advantages and principles of the invention. In the drawings.

DETAILED DESCRIPTION

Precision timing on the fly (TOF) delay line systems are designed to output delayed edges on pre-specified clock cycles. Embodiments consistent with the present invention eliminate non-desired clock edges from erroneously clocking new data into a delay line before it is intended. The embodiments include a high speed re-programable delay line employing a selective clock control circuit to load or reload delay data into delay circuits. They also include a clock qualifying circuit applied in a high speed re-programmable delay line system that enables an edge-based clock without unwanted glitches. This clock qualifying circuit enables an output clock signal on one input clock edge and re-sets the signal on the opposite edge.

Figure 1:
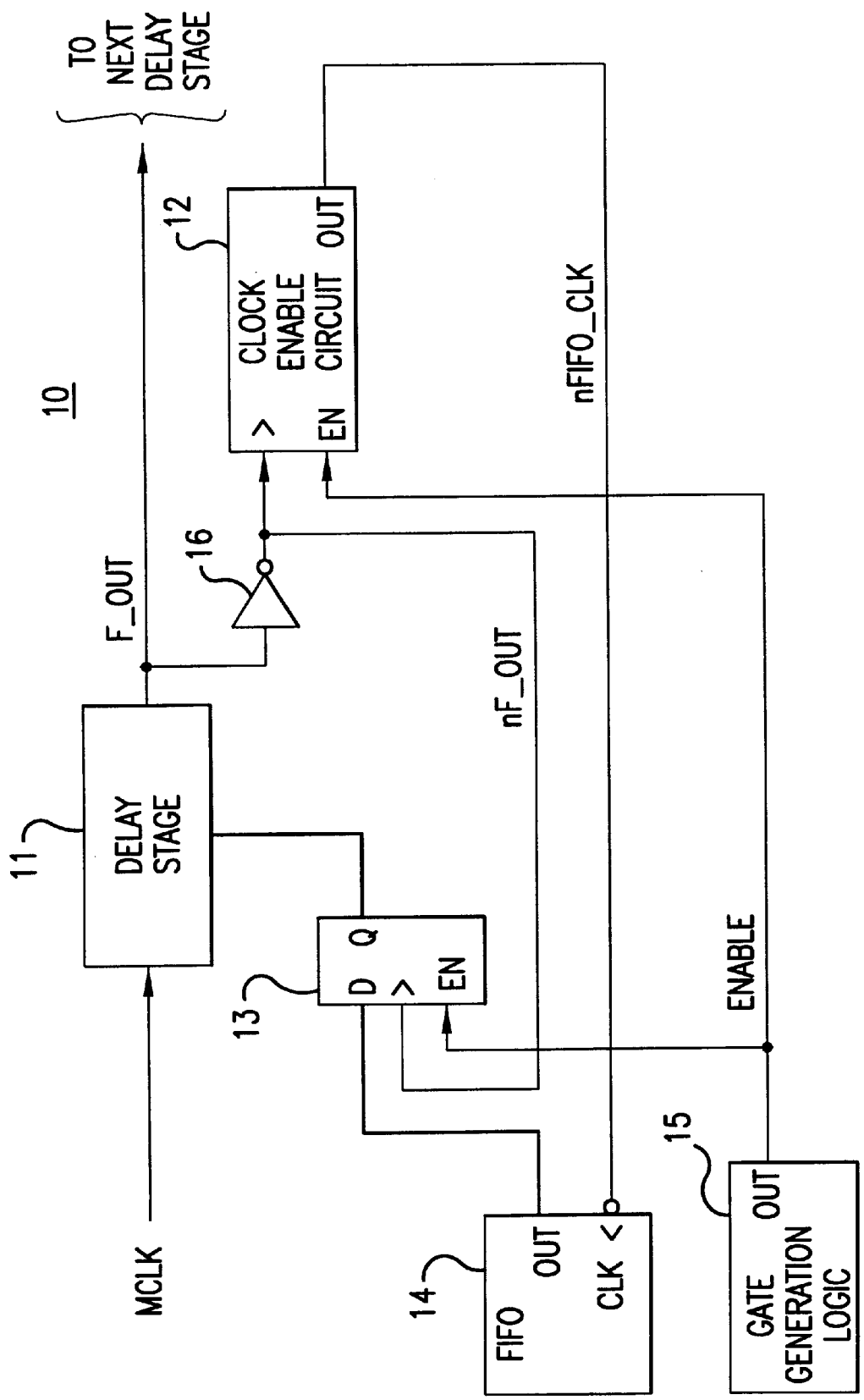
FIG. 1 is a diagram illustrating delay and control paths in a clock delay circuit for use in loading delay data.

FIG. 1 shows part of the delay and control paths for a high speed TOF system 10. A master clock (MCLK) signal is applied to a first delay stage 11. Delay stage 11 represents a programmable delay line. Delay stage 11 receives an input signal and outputs a delayed version of the input signal based upon a received programmable control signal, in this case a digital control value from a register 13. referred to as a delay line signal, in this example signal $F_{13}$ OUT. The programmability results from being able to change the digital control value, and that value is proportional to the amount of time delay produced. Any type of component for providing a delayed version of a signal can be used for implementing delay stage 11.

The delayed output of first delay stage 11 is applied to the next delay stage, as well as through an inverter 16 to a clock enable circuit 12. If an output is expected from a specific MCLK signal cycle, gate generation logic 15 outputs an ENABLE signal. Gate generation logic 15 accepts inputs from a core control logic FIFO clocked from a version of the MCLK clock. Gate generation logic 15 creates the ENABLE signal that is locally synchronized to the MCLK signal. The digital core logic generates control signals to be applied to gate generation logic 15 if a delayed output is desired during a particular MCLK cycle. Gate generation logic 15 uses control signals of the core logic to generate the ENABLE signal that is re-synchronized to the MCLK signal.

The ENABLE signal allows clock enable circuit 12 to pass the $F_{13}$ OUT signal to a FIFO circuit 14 as a falling edge signal nFIFO$_{13}$ CLK. FIFO circuit 14 can be implemented with a conventional FIFO memory circuit. The ENABLE signal also enables delay register 13 to apply the FIFO present output data to the delay line, represented by delay stage 11. FIFO circuit 14 clocks out the next output cycle delay data into a delay register pipeline at delay register 13. Since this data is now at the input of delay register 13, it will be clocked into the delay line at the next MCLK cycle that enables a delay line output.

Figure 2:
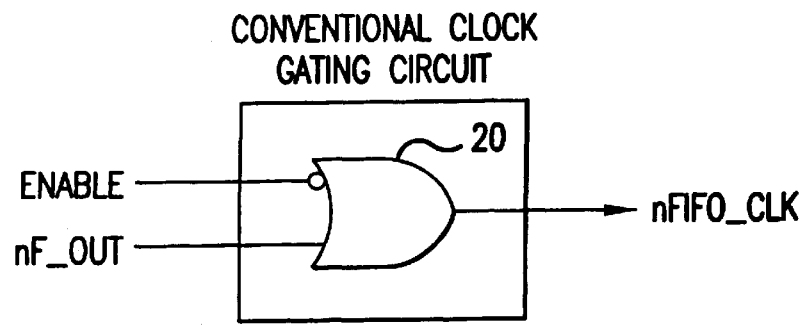
FIG. 2 is a diagram of a conventional clock gating circuit.

The control of the FIFO clock signal requires that a specified edge, in this case negative, be gated out at predetermined intervals. The TOF delay line subsystem is designed such that the negative edge to be gated is always within a gating window boundary, as determined by edges of the ENABLE signal. There are no restrictions on the placement of the unused rising edge of signal nF$_{13}$ OUT within the ENABLE window. However, the unpredictability of the rising clock edge generally prevents the use of simple combinational logic, such as a conventional clock gating circuit 20 shown in FIG. 2, for reliably loading delay data.

Figure 3:
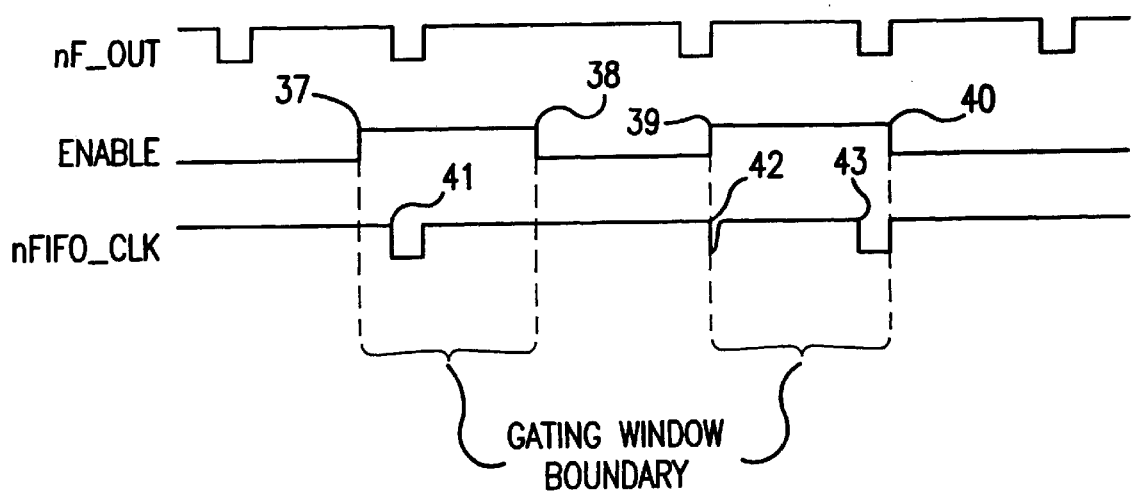
FIG. 3 is a timing diagram for the clock gating circuit shown in FIG. 2.

FIG. 3 shows the creation of a "glitch" 42 that could incorrectly clock FIFO 14 prematurely and place the wrong data at delay register 13 in system 10. FIG. 3 also illustrates the gating window boundaries formed by edges 37 and 38, and by edges 39 and 40, of the ENABLE signal for gating nFIFO$_{13}$ CLK signals 41 and 43.

Clock enable circuit 12 eliminates the "glitch" problem described above by qualifying the ENABLE signal with the falling edge of signal nF$_{13}$ OUT. Circuit 12 in this example requires no external timing control to gate the nF$_{13}$ OUT signal, resulting in a simple control interface and reduced circuit size.

Figure 4:
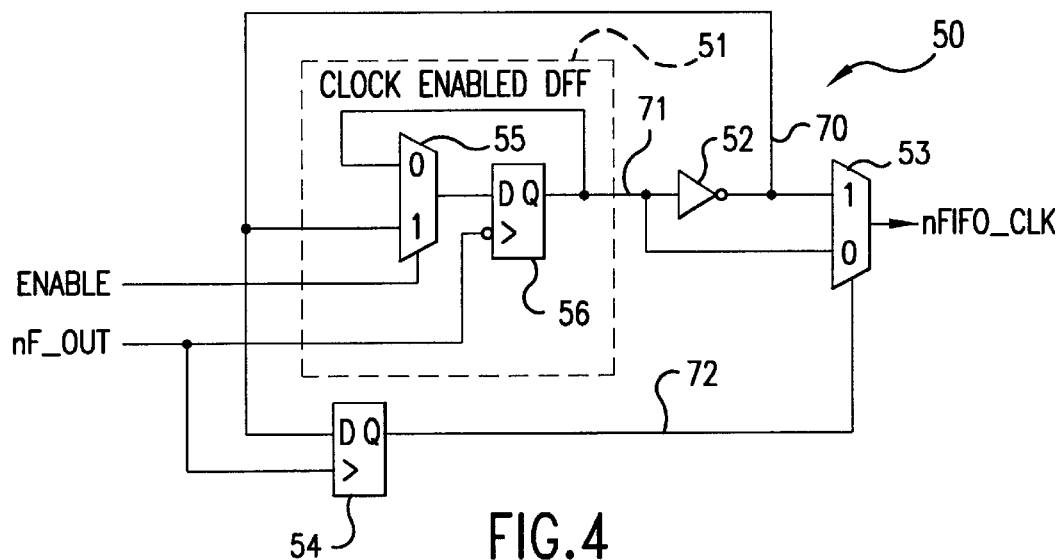
FIG. 4 is a diagram of a first-in-first-out (FIFO) window clock circuit.
Figure 5:
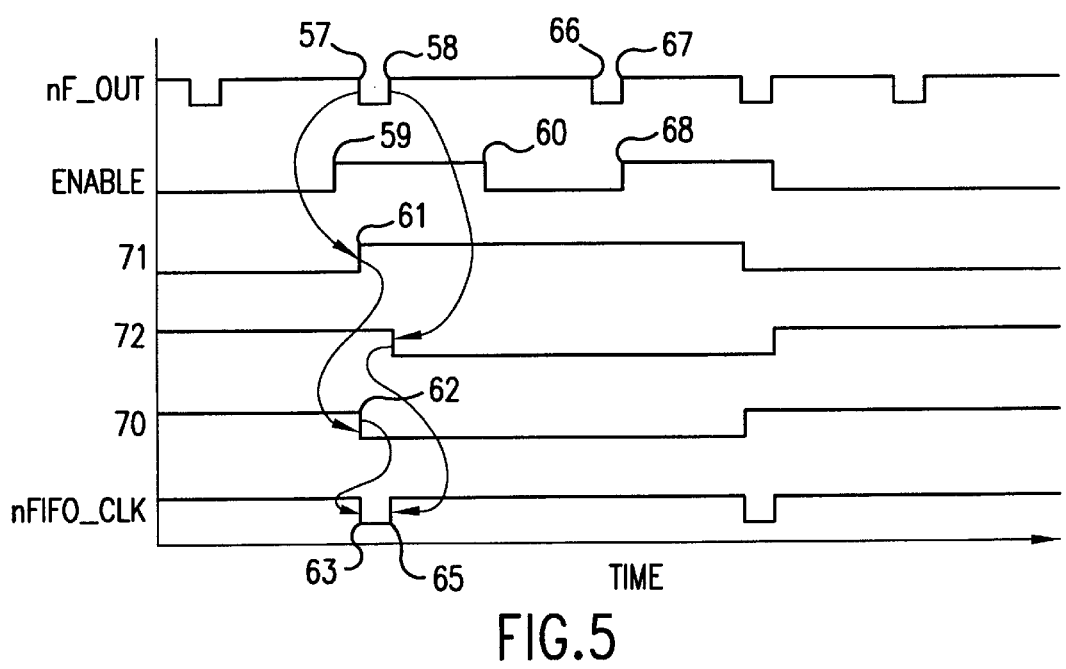
FIG. 5 is a timing diagram for the FIFO window clock circuit shown in FIG. 4.

FIG. 4 shows a FIFO window clock (FWC) circuit 50, implementing clock enable circuit 12, and FIG. 5 is a timing diagram illustrating its operation. FWC circuit 50 has inputs for receiving the ENABLE signal and a delay line signal, in this example the nF$_{13}$ OUT signal. It has an output for providing a delayed clock signal, in this example the nFIFO$_{13}$ CLK signal. A control circuit determines a state, and hence output signal, of FWC circuit 50. The control circuit switches FWC circuit 50 between states in response to edges of the nF$_{13}$ OUT signal.

Referring to FIGS. 4 and 5, FWC circuit 50 operates as follows. Signal nF$_{13}$ OUT is the inverted output from the delay line that is applied to FWC circuit 50. This signal is applied to the clock input of a negative edge triggered clock enabled DFF 51, operating as a control circuit. Clock enabled DFF 51 in this example is implemented with a D-type flip-flop (DFF) 56 with a feedback multiplexer 55 that provides a feedback loop by allowing recirculation of the "Q" output back to the "D" input of flip-flop 56 when the ENABLE signal is low. Thus, the output of clock enabled DFF 51 does not change while ENABLE is low.

The high ENABLE signal at edge 59 allows the falling edge of nF$_{13}$ OUT signal at edge 57 to clock the high signal at point 70 out of clock enabled DFF 51, causing the signal at point 71 to go high at edge 61. The signal at point 71 is also inverted by an inverter 52 to create a falling edge on the signal at point 70 and on edge 62.

The low-going signal at point 70 flows through a multiplexer 53 and exits as a falling edge on signal nFIFO$_{13}$ CLK at edge 63. This falling edge output signal is transmitted to FIFO 14 to clock out new delay data. Some time later, signal nF$_{13}$ OUT goes high at edge 58. The rising edge of signal nF$_{13}$ OUT is applied to a rising edge triggered DFF 54. The "D" input of DFF 54 at point 70 is now clocked out as a low-going signal at point 72 on edge 58 of signal nF$_{13}$ OUT. The low-going signal at point 72 forces multiplexer 53 to select the input of the signal at point 71 that is opposite in polarity of the previously-selected signal at point 70. The output nFIFO$_{13}$ CLK signal now passes the signal at point 71 and, as a result, goes high at edge 65.

During the next MCLK cycle, no output is desired and the ENABLE signal is held low from edges 60 to 68. As a result of the ENABLE signal held low, the next falling edge of signal nF$_{13}$ OUT at edge 66 has no effect on clock enabled DFF 51, and the signal at point 71 remains at its previous high value.

The next rising edge of signal nF$_{13}$ OUT at edge 67 has no effect on the output nFIFO$_{13}$ CLK signal and does not create any glitches due to the following. The previous falling edge of signal nF$_{13}$ OUT occurred when the ENABLE signal was low. This maintains the output state of the clock enabled DFF 51 unchanged, meaning the signal at point 71 and, hence, the signal at point 70. The unchanged state of the signals at points 70 and 71 means that the rising clock input to DFF 54 makes no output changes due to the previous rising edge input, resulting in the signal at point 72 remaining unchanged as well.

The effect of these unchanged states allows a falling edge output of FWC circuit 50 only when the ENABLE signal is asserted high and signal nF$_{13}$ OUT falls from a high value to a low value. Once this occurs, the next rising edge of signal F$_{13}$ OUT re-enables FWC circuit 50 regardless of the state of the ENABLE signal. Further rising edges of signal nF$_{13}$ OUT will not generate erroneous outputs (glitches), regardless of the state of the ENABLE signal.

Figure 6:
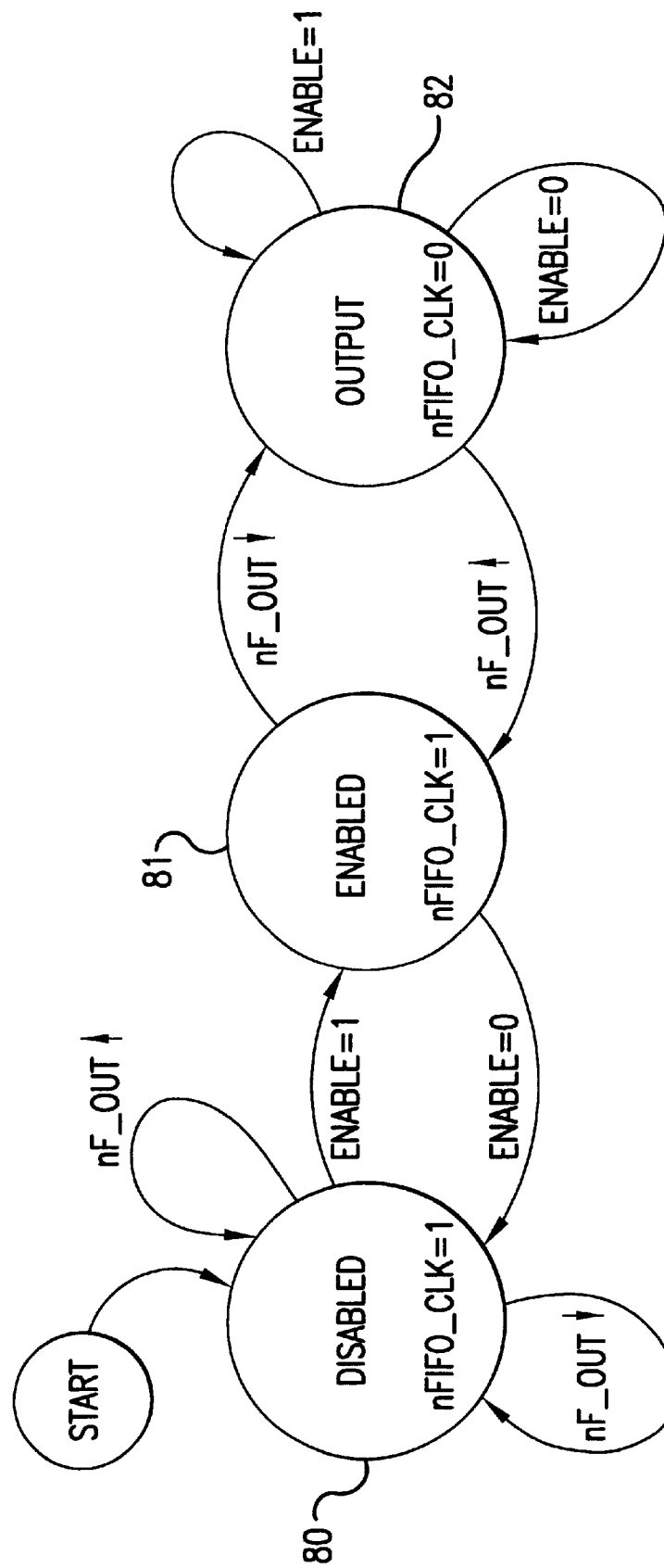
FIG. 6 is a state diagram illustrating the operation of the FIFO window clock circuit shown in FIG. 4.

The operation of FWC circuit 50 can be summarized in the state diagram of FIG. 6. In FIG. 6, FWC circuit 50 remains in a disabled state 80 regardless of a value of the nF$_{13}$ OUT signal until signal ENABLE goes high. Once the ENABLE signal is high, circuit 50 remains in an enabled state 81, providing a high nFIFO$_{13}$ CLK signal, until signal nF$_{13}$ OUT falls or the ENABLE signal goes low. A low-going ENABLE signal returns circuit 50 to disabled state 80. A falling nF$_{13}$ OUT signal takes circuit 50 from enabled state 81 to an output state 82, providing a low nFIFO$_{13}$ CLK signal. Circuit 50 remains in output state 82 until signal nF$_{13}$ OUT rises, regardless of the value of the ENABLE signal. Once signal nF$_{13}$ OUT rises, circuit 50 enters enabled state 81, and signal nFIFO$_{13}$ CLK goes high. Circuit 50 may now enter disabled state 80 if signal ENABLE goes low, or it may return to output state 82 if signal nFIFO$_{13}$ CLK falls.

FWC circuit 50 can be implemented with any components providing these states and with different complementary values of the signals resulting from the states. Use of clock enabled DFF 51 and the related circuit components are only one such example. Multiplexers 53 and 55 can be implemented, for example, with conventional two-to-one multiplexers or other circuits for selecting among input lines. Latches 54 and 56 can be implemented, for example, with flip-flops or other types of circuits for storing and outputting states of an input signal. Inverter 52 can be implemented with any circuit for inverting an input signal. Also, FWC circuit 50 can be used with different types of ENABLE signals and delay line signals, and with various types of delay stages and lines.

While the present invention has been described in connection with an exemplary embodiment, it will be understood that many modifications will be readily apparent to those skilled in the art, and this application is intended to cover any adaptations or variations thereof. For example, different types of circuit components to implement the functions of the FIFO, latches, multiplexers, inverter, and delay stage elements may be used without departing from the scope of the invention. This invention should be limited only by the claims and equivalents thereof.

What is claimed is:

1. A clock control circuit for loading delay data into delay circuits, comprising:

a clock enabled latch receiving an enable signal and a delay line signal and having an output;

a latch receiving the delay line signal and the output of the clock enabled latch; and a multiplexer, receiving the output of the clock enabled latch and being controlled by an output of the latch, for providing a signal to load delay data in response to the enable signal and the delay line signal.

2. The circuit of claim 1 wherein the clock enabled latch includes a feedback multiplexer connected to a feedback loop to receive the output of the clock enabled latch, the feedback multiplexer being controlled by the enable signal.

3. The circuit of claim 2, further including an inverter coupled between an output of the clock enabled latch and the feedback multiplexer.

4. The circuit of claim 3 wherein the multiplexer receives an output of the inverter.

5. The circuit of claim 1 wherein the clock enabled latch includes a flip-flop.

6. The circuit of claim 1 wherein the clock enabled latch provides constant output while receiving a particular value of the enable signal.

7. The circuit of claim 1, further including a first-in-first-out (FIFO) circuit clocked by an output signal of the multiplexer.

8. The circuit of claim 7, further including a delay stage receiving a master clock signal and providing the delay line signal.

9. The circuit of claim 7, further including gate generation logic providing the enable signal.

10. A clock control circuit for loading delay data into delay circuits, comprising:

an input for receiving an enable signal and a delay line signal;

an output for outputting a delayed clock signal having first and second states; and a control circuit, operably connected to the input, for providing an enabled state with the delayed clock signal in the first state and an output state with the delayed clock signal in the second state, and for switching between the enabled state and the output state in response to first and second edges of the delay line signal.

11. The circuit of claim 10 wherein the control circuit includes:

a clock enabled latch receiving the enable signal and the delay line signal and having an output;

a latch receiving the delay line signal and the output of the clock enabled latch; and a multiplexer, receiving the output of the clock enabled latch and being controlled by an output of the latch, for providing a signal to load delay data in response to the enable signal and the delay line signal.

12. The circuit of claim 11 wherein the clock enabled latch includes a feedback multiplexer connected to a feedback loop to receive the output of the clock enabled latch, the feedback multiplexer being controlled by the enable signal.

13. The circuit of claim 12, further including an inverter coupled between an output of the clock enabled latch and the feedback multiplexer.

14. The circuit of claim 13 wherein the multiplexer receives an output of the inverter.

15. The circuit of claim 11 wherein the clock enabled latch includes a flip-flop.

16. The circuit of claim 11 wherein the clock enabled latch provides a constant output while receiving a particular value of the enable signal.

17. The circuit of claim 11, further including a first-in-first-out (FIFO) circuit clocked by an output signal of the multiplexer.

18. The circuit of claim 17, further including a delay stage receiving a master clock signal and providing the delay line signal.

19. The circuit of claim 17, further including gate generation logic providing the enable signal.

20. A method of providing signals for use in loading delay data into delay circuits, comprising:

receiving an enable signal and a delay line signal;

outputting a delayed clock signal having first and second states;

providing an enabled state with the delayed clock signal in the first state and providing an output state with the delayed clock signal in the second state; and switching between the enabled state and the output state in response to first and second edges of the delay line signal.

* * * * *